April 28, 1953 F. A. WISSEL ET AL 2,636,939
KEYED AUTOMATIC GAIN CONTROL
Filed June 30, 1949
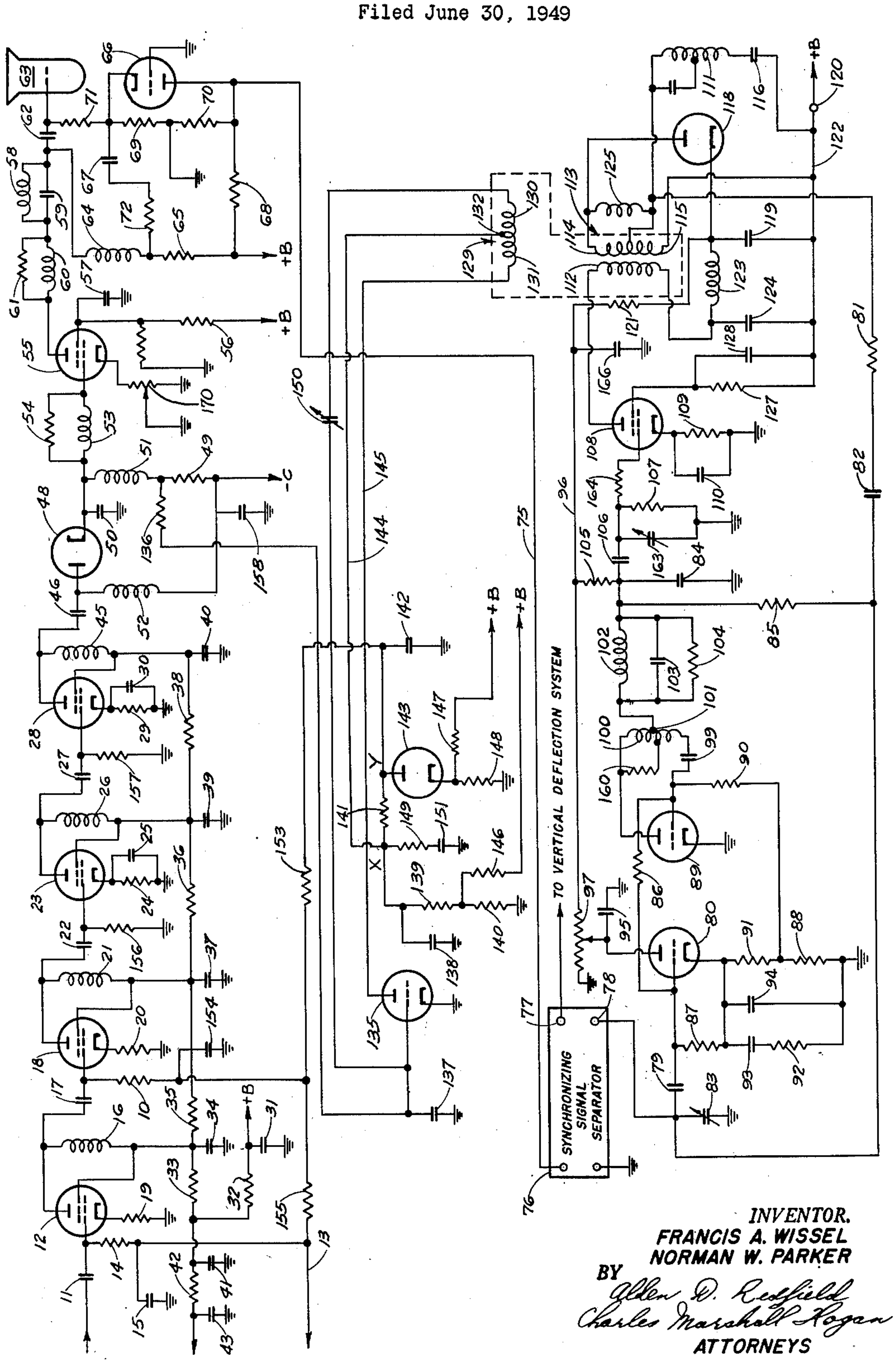
INVENTOR.
FRANCIS A. WISSEL
NORMAN W. PARKER
BY
Alden D. Redfield
Charles Marshall Hogan
ATTORNEYS Patented Apr. 28, 1953

2,636,939

UNITED STATES PATENT OFFICE 2,636,939

KEYED AUTOMATIC GAIN CONTROL

Francis A. Wissel and Norman W. Parker, Cincinnati, Ohio, assignors to Avco Manufacturing Corporation, Cincinnati, Ohio, a corporation of Delaware Application June 30, 1949, Serial No. 102,176

4 Claims. (Cl. 178—7.3)

The present invention is a novel automatic gain control (AGC) circuit for television receivers.

A number of AGC circuits have been developed, and research in this field has been very active. It has been directed to the finding of an efficient AGC system with good brightness stability, freedom from flicker normally caused by line voltage fluctuations, a high degree of immunity from noise interference, and easy adaptability to use in conventional television receivers, with a minimum loss in gain and bandwith and a minimum cost. The present invention is directed to those objectives.

It is an object of the present invention to provide a fast AGC circuit which reduces and substantially eliminates the effects of fast fading and interference normally caused by passing airplanes.

Another object of the invention is to provide an AGC circuit which maintains the video output signals at an optimum level for sync signal separation.

A primary object of the invention is to provide an AGC circuit of the type which uses a triode pulse rectifier or equivalent for purposes of amplification, together with associated circuit elements which cause the development of AGC potentials as applied to the controlled stages to be delayed until the rectifier plate current is of sufficient magnitude that the amplifier is operating under conditions of high gain. The expression "triode" as used in the specification and in the claims appended hereto is intended to designate not only the type of electron tube which is technically known as a triode, but also any electron tube of the type which includes at least a cathode, an anode, and a control electrode. This expression will therefore be understood to include tetrodes, pentodes and the like.

A further object of the present invention is to provide an amplified automatic gain control circuit which utilizes grid current limiting in the amplifier stage in such a way that the region between sync signal pulse peaks and grid current flow is so small that the amplifier operation is not adversely affected by extremely large noise pulses.

A particularly important object of the invention is to provide an automatic gain control circuit of substantially ideal character which does not affect television receiver amplification until the incoming carrier signal reaches a level sufficient to produce an adequate voltage at the input of the second detector, and which with larger signals maintains the output relatively constant.

Another object of the invention is to provide an automatic gain control system of the keyed type, employing a triode pulse rectifier so arranged that at the threshold (i. e., the instant at which the input signal level becomes so great that the automatic gain control potential becomes effective) the pulse rectifier is operating in a region of very high gain, as distinguished from conventional systems at which the pulse rectifier is operating near cut-off, so that the AGC potential is developed at low gain as soon as conduction occurs. The pulse rectifier is operating under conditions of high gain in the sense that the D. C. output voltage is very sensitive to changes in peak pulse input level. The rectifier functions to measure and amplify the peak input level.

It is also an object of the present invention to provide an automatic gain control circuit which has such excellent internal gain characteristics that it may be controlled from the output of the video detector to operate at detector voltage levels, permitting the use of only one stage of video amplification and thereby effecting substantial economies in the production of low cost television receivers.

A further object of the invention is to provide an automatic gain control circuit in which the tube conventionally referred to as the amplifier tube does not require the biasing of its grid and cathode at "B potential," this requirement being characteristic of DC coupled amplifiers and occasioning disadvantages and limitations well-known to the art, such as instability, susceptibility to supply voltage fluctuations, special insulation problems, and additional filament circuitry.

For a better understanding of the present invention, together with other and further objects, advantages and capabilities thereof, reference is made to the following description of the accompanying drawing, in which there is shown a preferred illustrative form of AGC system in accordance with the invention, as embodied in a television receiver.

In the drawing, the single figure is a circuit schematic, partly in block form, showing a preferred form of my AGC system as adapted for use with a television receiver.

In accordance with the invention, as narrowly viewed for explanatory purposes, there is provided:

An automatic gain control system for use with a television receiver of the type including a gain-controlled video channel (12, 18, etc.), a video detector (48, etc.), and a line-frequency deflection system (80, 89, 108, 118, etc.) providing a source of line-frequency pulses, comprising the combination of an electron tube (135) having anode, cathode and grid electrodes for plate-rectifying said pulses, means including a series grid resistor (136) having a value high with respect to the cathode-grid impedance of said tube (when the grid is positive with respect to the cathode) for coupling said detector to the grid circuit of said tube, so as to apply to said circuit the detected signal, a source (—C) of fixed negative bias for said grid, said detector and coupling means and bias source being so arranged that the peaks of the synchronizing signal components render said tube conductive and that the region between those peaks and the grid circuit limiting condition is very narrow, whereby noise peaks extending in the direction of and beyond said synchronizing component peaks are limited, an inductance (131) coupled to said line-frequency pulse source for applying to said anode said pulses of line-frequency, resistor means (139, 140) effectively in series with said inductance for applying to said anode a fixed positive bias and differentially combining said positive bias and the rectified pulses appearing at said anode, the output potential of the last-mentioned resistor means being positive with respect to ground at zero video signal level and becoming less positive and finally negative as the video signal level is increased, a shunt capacitor (136) cooperating with said resistor means to form a short time-constant filter for said rectified pulses, means in shunt with said differential-combining resistor for applying said output to the controlled stages as an amplified AGC potential only when it is of negative polarity, comprising a series combination of a diode (143) and a resistor (141) having a value great with respect to the resistance of said diode, one terminal of said resistor being connected to said differential-combining resistor means, whereby the plate rectification current of said electron tube has substantially departed from the cut-off condition into a region of high gain when said output is applied to the controlled stages, and a capacitor (142) in shunt with said diode and cooperating with the last-named resistor to form a long time-constant filter for said output potential.

The scope of the invention is as indicated in the appended claims. Subject matter disclosed but not claimed herein is covered in our copending patent application Serial No. 321,882, filed November 21, 1952, entitled "Automatic Gain Control" and assigned to the assignee of the present application and invention.

The specific description begins with a brief explanation of a typical channel which is controlled by the automatic gain control circuit in accordance with the invention. In the present illustrative disclosure, the novel automatic gain control circuit is shown as incorporated in a superheterodyne television receiver of the intercarrier sound type. This receiver includes the usual antenna, and a tuner having antenna input and oscillator modulator stages (not herein shown).

The intermediate frequency video carrier signals in this receiver are applied through a coupling capacitor 11 to the input circuit of an I. F. amplifier tube 12, the grid of this tube being returned to an automatic gain control line 13 through a resistor 14, the cathode of this tube being connected to a biasing resistor 19. This first I. F. stage is coupled, as by an inductor 16 and a capacitor 17, to the input circuit of a second I. F. stage including an electron tube 18, which is similarly provided with a grid resistor 10 and a cathode impedance 20 and is coupled to the input of a third I. F. stage as by an inductor 21 and a capacitor 22. The third I. F. stage comprises an electron tube 23, the cathode of which is biased by a resistor 24, by-passed by a capacitor 25. This stage is similarly coupled, as by an inductor 26 and a capacitor 27, to the input of a fourth and final I. F. stage consisting of an electron tube 28, the cathode of which is connected to a biasing resistor 29, by-passed by a capacitor 30. Plate and screen potentials for these tubes are furnished from a source of space current (not shown) coupled to a filter network comprising series resistors and shunt capacitors designated by the reference numerals 31, 32, 33, 34, 35, 36, 37, 38, 39, and 40. The filter section indicated by the reference numerals 41, 42, and 43 provides anode potentials for the R. F. input oscillator and modulator stages (not shown).

The final I. F. stage is coupled, as by an inductor 45, a capacitor 46, and an inductor 52, to a conventional detector network comprising a diode 48 and other circuit elements, the purpose of which is to produce a flat video response characteristic throughout a wide range of frequencies of from approximately 30 cycles to more than four megacycles. Specifically, this detector includes a network consisting of a load resistor 49, a capacitor 50, a shunt peaking inductor 51, and series peaking inductor 53, the latter being shunted by a damping resistor 54 and connected to the grid of a single tube 55 included in a video frequency amplifying stage. A variable cathode bias is provided for contrast control purposes, degeneration being adjusted as desired. The screen is by-passed by a capacitor 57, and the anode output is taken off through a series peaking circuit, comprising a parallel combination of an inductor 60 and a damping resistor 61, and a resonant circuit, comprising a parallel combination of inductor 58 and capacitor 59, and a coupling capacitor 62 connected to the grid of a cathode ray picture tube 63. The anode of the video amplifier has a load comprising a series combination of an inductor 64 and a resistor 65, leading to a source of space current not shown. The direct current reinserting circuit comprises a grounded-grid triode 66 having its cathode coupled to the lower end of coil 64 through a capacitor 67 and a resistor 72 and having its plate connected to the lower end of resistor 65 through a resistor 68. The cathode-anode circuit of triode 66 is shunted by a series combination of resistors 69 and 70. As is well-known to those skilled in the art, a direct current component which is a measure of the over-all illumination appears at the cathode of tube 66 and is applied to the grid of the picture tube through a resistor 71. D. C. restorer networks of this general character are shown and described in a number of publications, including U. S. Patent No. 2,240,281, issued to R. C. Ballard on April 29, 1941.

In the foregoing description, and in fact throughout this disclosure, wave traps, filters, iron cores, and other elements which need not be shown in order to illustrate or to disclose or describe the present invention or an appropriate background for the invention are omitted for purposes of simplicity and clarity, so far as possible.

The above-described elements which begin with the reference numeral 10 and end with the reference numeral 72 collectively show the channel which is controlled and the significant elements of that channel between the tuner and the picture tube. In brief, these elements show that which is controlled by the AGC system in accordance with the invention. It will be understood that the invention is not confined to this specific type of controlled channel but may be utilized in any television receiver environment wherein AGC is desired.

This automatic gain control is of the keyed type, and the description now proceeds to a discussion of the arrangement by which the keying pulses are developed.

The horizontal and vertical synchronizing pulses are applied, as by a conductor 75, from the anode of the grounded grid D. C. restorer and sync separator stage to a conventional synchronizing signal separator 76, herein shown in block form, this unit performing the usual function of separating the vertical pulses from the horizontal pulses. A terminal 77 of the separator network 76 is connected to the vertical deflection system, which need not be shown herein for purposes of describing the present invention.

The illustrative horizontal system herein shown comprises a blocking oscillator with automatic pulse width control. The horizontal synchronizing pulses are applied with positive polarity from terminal 78 of the synchronizing signal separator through a coupling capacitor 79 to the grid of a triode 80. High voltage negative pulses obtained from the horizontal deflection system are partially integrated and attenuated by a network comprising series resistor 81, series capacitor 82, and adjustable shunt capacitor 83, and are also applied to the grid of tube 80. Pulses of a third wave shape are obtained from the discharge capacitor 84 and integrated by a network comprising series resistor 85 and shunt capacitor 83 to form parabolic wave shapes. Tube 80 is the control tube and is biased near cut-off by the D. C. component of the blocking oscillator grid voltage applied through resistors 86 and 87. The plate current of tube 80 consists essentially of pulses the width of which is determined by the relative phases of the synchronizing pulses from terminal 78 and the parabolic pulses formed by the network 83, 85. The voltage developed across a resistor 88 by this average plate current is injected from the cathode circuit of tube 80 into the grid of the blocking oscillator triode 89 by way of a resistor 90, in order to maintain the phase relationship between the oscillator output and the synchronizing signals. The cathode circuit of tube 80 is an integrating network comprising resistors 88, 91, and 92 and capacitors 93 and 94. The cathode circuit integrating network has a fast response, in that capacitor 94 is relatively small, and a slow response, in that resistors 91 and 88 are relatively large. The fast time-constant network tends to prevent hunting, while the slow time-constant network filters out disturbances of greater duration.

The plate of the control tube is by-passed by a capacitor 95 and connected to the anode voltage line 96 through a potentiometer 97. The automatic pulse width control circuit is fully described in the article entitled "Automatic frequency phase control of television sweep circuits," Proceedings of the I. R. E., 1949, page 497 et seq., volume 37, No. 5, published by the Institute of Radio Engineers, New York, May 1949. Reference is made to this publication for a complete description of the automatic pulse width control circuit.

The plate current flow of tube 80, passing through the cathode resistor 88, controls the grid circuit time constant of the blocking oscillator tube 89 to produce synchronization, this resistor 88 being common to the grid circuit of blocking oscillator tube 89 and the time-constant circuit comprising capacitor 99, resistor 90, and resistor 88.

The blocking oscillator circuit comprises a triode 89, an auto-transformer or inductor 100 arranged in a series combination with capacitor 99 coupled between plate and grid, and a discharge capacitor 84 effectively coupled between a tap 101 on the auto-transformer and ground. A resonant circuit comprising a parallel combination of an inductor 102, a capacitor 103, and a damping resistor 104 is interposed between this tap and the high potential terminal of capacitor 84. Plate voltage is supplied to the blocking oscillator through a circuit comprising lead 96, dropping resistor 105, inductor 102, tap 101, and a part of auto-transformer 100. The sawtooth voltages employed for horizontal deflection are developed across discharge capacitor 84, tube 89 functioning not only as a blocking oscillator tube but also as a discharge tube, as described in the afore-mentioned article in the May 1949 issue of Proceedings of the I. R. E.

The discharge capacitor is coupled, as by a capacitor 106 and a grid resistor 107, to the grid of a horizontal output amplifier tube 108, the latter being provided with a cathode resistor 109 by-passed by a capacitor 110. The output of this amplifier stage is coupled by a transformer network 112—115 to the deflecting coils 111, and the current waves appearing in the plate circuit of this amplifier tube are employed to produce periodically recurring sawtooth currents of line frequency in coils 111, thereby to deflect the electronic beam in the picture tube at line frequency.

The system intercoupling the horizontal output tube and the deflection yoke will be understood by reference to the following patents and publications: Kiver, Television Simplified, pages 207–213, second edition, 1948, D. Van Nostrand, Inc., New York; U. S. Patent No. 2,440,418, Tourshou. Reference to those publications is made for a detailed description of this network. Briefly, however, the primary 112 of the horizontal output transformer is coupled to a secondary 113 comprising series portions 114 and 115, of which portion 115 is coupled across the yoke circuit 111, 116. It will be understood that the coils 111 form part of a yoke assembly encircling the neck of the cathode ray image reproducing tube 63.

The voltage variations applied to the control electrode of power tube 108 produce a rising current in tube 108 during scansion, which current is cut off at the beginning of retrace time. The current in the deflection coils 111 and the horizontal output transformer does not disappear at the instant of cut-off of tube 108, however, due to the inherent distributed capacity of the circuit. The inductance of these coils and the transformer, together with the above-mentioned distributed capacity, forms a tuned circuit in which high frequency oscillations would normally be produced. These oscillations begin with the start of retrace time and continue for one-half of the normal period of oscillation, the oscillation being stopped at the negative current peak by a series combination of a diode 118 and a capacitor 119 connected across the secondary 113. The polarities immediately following retrace are such that damper tube 118 conducts and continues to conduct until tube 108 again becomes conductive. The voltage developed across capacitor 119 is such as to increase or boost the voltage of the D. C. power source (not shown) connected to terminal 120. It will be noted that anode potential line 96 is connected to this terminal through a series circuit comprising resistor 121, capacitor 119, and line 122, to supply anode potential to tubes 80 and 89. The plate of tube 108 is connected to terminal 120 through primary 112, inductor 123, capacitor 119, and lead 122, to supply anode potential to tube 108.

The primary winding 112 of the horizontal output transformer is connected to a capacitor 124 in such a manner that a varying voltage is developed across capacitor 124, which voltage is applied to capacitor 119 through an inductor 123, for purposes of linearity control.

For purposes of width control, there is connected in shunt with portion 114 of secondary 113 an inductor 125. The operation of the width control is well-known to those skilled in the art and is considered in such publications as U. S. Patent 2,449,969 to Wright.

The horizontal output transformer also includes a winding 129 having two portions, 130 and 131, and a tap 132, the winding 129 being inductively coupled to the primary and secondary windings.

The elements beginning with the reference numeral 75 and ending with the reference numeral 132 are herein shown for the purpose of disclosing an illustrative source of keying pulses employed in the automatic gain control system in accordance with the invention. It will be understood that the keying pulse source collectively designated by the reference numerals beginning with 75 and ending with 132 is illustrative and that other arrangements for deriving keying pulses from the horizontal deflecting system may be employed.

Having described the channel which is controlled and the circuit arrangements which function as a source of keying pulses for the automatic gain control system in accordance with the present invention, the description now proceeds to the latter.

The automatic gain control circuit in accordance with the invention comprises the following principal components:

First, a pulse rectifier stage comprising a triode 135, the control electrode of which is coupled to the video detector load resistor 49 by a network comprising a series resistor 136 and a shunt capacitor 137;

Second, a short time-constant R. C. network in the anode circuit of tube 135, comprising a parallel combination of capacitor 138 and series resistors 139, 140, the junction point being connected to this anode through portion 131 of winding 129;

Third, a long time-constant network comprising a series resistor 141 and a shunt capacitor 142;

Fourth, a diode clamping circuit including a tube 143;

Fifth, a source of positive biasing potential effectively inserted in series with the plate of triode 135, this potential being developed across resistor 140, one terminal of which is grounded, the other terminal of which is in circuit with the anode, the circuit being traced through conductor 144, portion 131 of winding 129 and conductor 145. The junction of resistors 139 and 140 is accordingly connected through a resistor 146 to a source of anode voltage (not shown), the presence of which is indicated in conventional fashion by an arrow.

A voltage divider network comprising resistor 147 (connected to a direct current voltage source) and cathode resistor 148 is provided in order to compensate for contact potential in diode 143.

The input admittance of tube 135 is neutralized by a capacitor 150, which couples the plate and grid circuits of tube 135 in such a way that the current passing through it is of the proper amplitude and phase to neutralize the effect of the current flowing between the plate and grid circuits of tube 135 via the grid-plate capacitance. The voltage at the end of winding portion 130 connected to capacitor 150 is in phase opposition to the voltage at the end of winding portion 131 connected to the plate of tube 135.

The voltage across the neutralizing inductance 130 causes the grid of tube 135, connected to capacitor 150, to receive a current which neutralizes energy transfer through the tube capacitance, as explained by Terman, Radio Engineering, pages 367 et seq., third edition, 1947, McGraw-Hill Book Co., Inc., New York, New York.

It will be seen that winding portion 131 is in series with the plate circuit of pulse rectifier 135 and serves as a source of positive pulses (developed during retrace) of line frequency which periodically key triode 135 into conductivity. The triode plate-rectifies into the short time-constant network comprising resistors 139, 140, and capacitor 138.

A damping circuit comprising a series combination of a resistor 149 and a capacitor 151 is provided between center tap 132 and ground to prevent "hunting" of the AGC level.

This circuit has several desirable characteristics which are not found together in conventional AGC systems:

First, a fast time constant, whereby the system is effective in overcoming the adverse effects of rapid level variations, such as airplane flutter;

Second, a gain so high that a signal level change of 4000 to 1 does not substantially alter the video output level, once the level is such as to overcome the delay;

Third, an exceedingly sharp threshold, which affords good delayed AGC action, providing maximum gain at very low input signal levels and a relatively constant output at voltages above threshold.

This circuit is of the keyed type. There are derived control pulses which are a function of the amplitude of the derived synchronizing signal components of the video signal output of the detector. The control pulses are taken from the video detector and are applied to the grid of tube 135 by the network comprising resistor 49, resistor 136, and capacitor 137. Resistor 136 isolates capacitor 137 from the video channel including elements 54, 53. It will be noted that the grid of tube 135 is D. C. coupled to the detector, so that the D. C. component of the video signal is not lost. Resistor 136 and capacitor 137 provide a filter which cuts off at approximately 150 kilocycles, thereby discriminating against noise and interference. It is desirable that the filter comprising the elements 136 and 137 have a cut-off characteristic such that the synchronizing pulse components derived by the video detector and appearing at the output thereof are applied with substantially full amplitude to the input of tube 135, although distortion as to the wave forms of these pulses is desired. In other words, the network 136 and 137 should discriminate against high frequency noise and in doing so will somewhat distort the wave shapes. The object of the filter 136, 137 is to apply these pulses to the grid of tube 135 with the optimum signal to noise ratio. The fundamental frequency of these pulses being on the order of 15,000 cycles, a filter having a high frequency cut-off characteristics of 150 kilocycles has been found entirely satisfactory. The output of such a filter contains the necessary information concerning the peak height of the synchronizing signals. Any increase in band width over that required to indicate such height would reduce discrimination against noise and serve no useful purpose. Resistor 136 also provides grid circuit clipping, in tube 135, of large impulse noise pulses of positive polarity. This series grid resistor 136 is very large compared to the grid-to-cathode resistance of tube 135 when grid current flows, so that the input signal to tube 135 is limited to the voltage level of the grounded cathode. When noise pulses tend to cause the grid of tube 135 to become positive with respect to the cathode, the grid-to-cathode resistance drops to a negligible value with respect to that of resistor 136 and the grid current flow in resistor 136 develops a bias which opposes the positive noise pulses.

As stated above, the control pulses are applied to the input circuit of tube 135 to develop an amplified AGC potential. This is accomplished by plate rectification of the line frequency pulses of positive polarity applied to the plate circuit of tube 135. These pulses are developed, during retrace intervals, in winding 131, included in the horizontal output transformer. Winding 131 is included in a series circuit comprising the anode of tube 135, line 145, winding 131, line 144 and the parallel combination of capacitor 138 and resistors 139, 140.

Tube 135 is periodically keyed into conductivity to develop, by plate rectification, across resistors 139, 140, an amplified AGC potential. The pulses applied to the anode being constant, the plate current pulses of tube 135, of negative polarity, are a function of the amplitude of the grid voltage peaks, which are in turn a function of the line-frequency synchronizing signal amplitude, the latter being a function of video signal output level at the detector. The AGC system in accordance with the invention is particularly insensitive to noise in that the amplified AGC potential is developed during phase coincidence of the pulses applied to grid and plate of tube 135, which pulses occupy but a very small total time as compared to the duration of one line, for example. During the remaining major time portions, the system is entirely immune from noise interference.

The invention successfully solves two problems which arise in keyed systems: First, it prevents the application of AGC potentials to the controlled stages as soon as conduction occurs in triode 135; second, it operates in such a way that the gain of tube 135 is very high when AGC potential is applied to tubes 12, 13. For these purposes, there is placed in the output network of tube 135 a source of positive bias, which causes the potential between point X and ground (X being the junction of resistors 139 and 141) to be positive until the voltage drop accompanying pulse-rectification plate current of tube 135, flowing through resistors 139 and 146, reaches such a value that the potential of point X becomes negative. AGC potential is then applied to the controlled stages (tubes 12 and 13, for example). Negative AGC potential is not developed between point X and ground as soon as tube 135 becomes conductive. It is developed only when the voltage produced by the plate current flow of tube 135 across resistor 139 is sufficient to overcome the positive voltage across resistor 140. The junction of resistors 139 and 140 is connected through a resistor 146 to a source of positive bias (not shown). The network 146, 140 is simply a means for placing a source of positive anode voltage in series with the tube 135 and the network 139, 140 causes that voltage to be differentially combined with the rectified pulse voltage.

It is known that the gain of a triode tube, or equivalent, such as tube 135, is low when operating near cut-off. That is the reason why prior art systems, which operate the pulse rectifying triode in the cut-off region, possess relatively low gain. In those systems AGC potential is developed as soon as the triode becomes conductive. In accordance with the present invention, AGC potential is not applied to the controlled stage until a substantial amount of current is flowing in the triode plate circuit, under which condition the triode is operating at high gain.

A short time-constant circuit is employed in the plate circuit of tube 135. It comprises capacitor 138, in parallel with the series combination of resistors 139, 140, between conductor 144 (plate of tube 135) and ground. This time-constant circuit permits a fast recovery or large percentage of current decay in a horizontal line interval. The time-constant circuit comprising elements 138, 139, and 140, viewed from the standpoint of noise, should be as short as possible in order to minimize the energy stored by noise pulses. From this point of view a time constant of one line would be desirable. However, the average voltage produced by the output of tube 135 increases with a longer time constant, which results in increased gain. A time constant equal to 25 lines has been found satisfactory, where maximum gain is sought, although this time constant may go down as low as 4 or 5 lines while still attaining a reasonable compromise between maximum gain and insensitivity to noise. The expression "short time-constant circuit" as used herein is limited to a circuit having a time constant of between 4 and 25 horizontal lines in duration. This short time-constant circuit is followed by a long time-constant circuit comprising a series combination of a resistor 141 and a capacitor 142, connected between point X and ground. The long time-constant network is helpful in eliminating the effects of noise pulses in that the effect of noise pulses is spread over a long period of time, their energy content being small with respect to the energy content of the pulses purposely applied to the grid and plate of tube 135. The time constant of the network comprising elements 141, 142, 149, and 151 from the standpoint of ideal theory should not be shorter than the period of one vertical field. It should not be so long as to impair its efficacy in correcting for such disturbances as airplane flutter and supply fluctuations. Specifically, a time constant of the order of 1/20 of a second has in practice been found to be satisfactory.

The long time-constant network also filters out the A. C. component appearing across capacitor 138 and the undesired 60 cycle component from the vertical deflection system. In the presence of noise, capacitor 138 receives a charge, but its capacitance is so low that the energy stored is low.

Anti-hunting networks such as that indicated by the elements 149 and 151 in the gain control circuit are well-known to those skilled in the art. It will be understood that any automatic gain controlled receiver is essentially capable of undesired oscillation, in that the channel which is controlled indicates its response to the order of the gain control circuit which accomplishes the control. This response is indicated to the gain control circuit so that the gain control circuit and the channel which is controlled together constitute a feedback loop. It is characteristic of any feedback loop that at some frequency there is a phase coincidence between order and response. It is the object of the network 149, 151 to make the gain of the feedback loop a minimum at this "hunting" frequency, without disturbing the essential operation and function of the gain control circuit.

Shunted between the junction of capacitor 142 and resistor 141 and ground is a diode 143, its plate being connected to that junction. The diode is provided with a cathode resistor 148, the high potential side of which is connected through a resistor 147 to the positive terminal of a source of potential (not shown), the purpose of which is to cause to flow in resistor 148 a current of positive polarity and a voltage drop of sufficient magnitude to overcome the contact potential of the diode 143. The term "contact potential" is well-known to those skilled in the art, and this phenomenon is discussed at pages 8 and 9 of Reich's Theory and Application of Electron Tubes, second edition, McGraw-Hill Book Co., Inc., New York, 1944. It has been noted that when the incoming carrier signal level is low, point X is at a positive potential. A positive potential therefore exists between point X and ground, over the series circuit comprising resistor 141, diode 143, and resistor 148, so that the diode is conductive when point X is positive. The diode resistance, however, is so small with respect to that of resistor 141 that the potential drop across the diode is very small. Therefore, under this assumed condition of low signal strength, point Y, the diode plate, is essentially at ground potential, and no AGC voltage is applied to the controlled stages.

As the carrier signal level increases, the plate current pulses of tube 135 increase, and point X falls to ground potential, at which time the automatic gain control threshold is attained. At this time tube 135 is operating with very high gain at a point removed from cut-off, and diode 143 becomes non-conductive since the potential at point X is going negative. As the carrier signal level continues to increase, point X becomes more negative and the amplified AGC potential appearing across capacitor 142 and applied to the controlled stages increases. This potential is filtered by the network comprising capacitor 142 and series resistor 153. The filter 153, 154 filters the AGC potential applied to tube 18, and the AGC potential applied to tube 12 is further filtered by the combination of series resistor 155 and shunt capacitor 15.

The AGC conductor 13 may, if desired, be continued to the tuner stages (not shown) in order that AGC potential may be applied thereto.

An important feature of the present invention resides in the fact that it assures further immunity against noise by reason of the fact that the synchronizing signal pulse peaks, as applied to tube 135, are very close to the zero bias level, whereby a narrow region exists between the peaks of these pulses and the grid current limiting condition, so that noise pulses superimposed on the synchronizing pulses cause very little disturbance. In other words, the action of tube 135 is very "fast" in limiting noise peaks. On the other hand, in accordance with another important feature of the invention, AGC potentials are not actually applied to the controlled stages until the received carrier signals attain a predetermined level. Before such level is attained, tube 135 has already become conductive and reached a point of efficient operation, so that in this sense the tube circuit is effectively "slow" in developing AGC potential. As indicated above, the derived synchronizing signal components are applied to the input of tube 135. The grid of that tube is biased from a source of negative potential, indicated by the expression −C, in such a way that the positive going synchronizing signal peaks extend to a level near zero bias. The region between these peaks and grid-circuit limiting is so narrow that positive going noise pulses have a very limited range of action between the synchronizing signal peaks and the grid current flow region. As soon as the noise peaks reach the grid-circuit limiting level, the grid circuit of tube 135 becomes conductive, and the grid circuit limiting occasioned by the high grid resistor 136 very effectively cuts off the noise peaks. The noise peaks do not in theory have to be insured against unless they occur in coincidence with the keying pulses applied to the plate of tube 135. Under normal conditions these keying pulses are in coincidence with the synchronizing pulses applied to the grid of tube 135. The circuit in accordance with the present invention not only provides the advantages of the keyed system, wherein there is insensitivity to asynchronous noise, but the invention further provides the above-described clipping of synchronous noise.

The following circuit parameters have been found satisfactory in one successful embodiment of the present invention:

| | |
|---|---|
| Capacitor 11 | 100 mmf. |
| Capacitor 15 | 0.005 mfd. |
| Resistor 14 | 10,000 ohms. |
| Resistor 10 | 82 ohms. |
| Resistor 20 | 82 ohms. |
| Tubes 12, 18, 23 | Type 6AU6. |
| Capacitor 17 | 100 mmf. |
| Capacitor 22 | 100 mmf. |
| Resistor 24 | 82 ohms. |
| Capacitor 25 | 5000 mmf. |
| Capacitor 27 | 100 mmf. |
| Resistor 156 | 5600 ohms. |
| Resistor 157 | 10,000 ohms. |
| Resistor 29 | 68 ohms. |
| Capacitor 30 | 5000 mmf. |
| Capacitor 40 | 5000 mmf. |
| Resistor 38 | 100 ohms. |
| Capacitor 39 | 5000 mmf. |
| Resistor 36 | 100 ohms. |
| Capacitor 37 | 5000 mmf. |
| Resistor 35 | 1100 ohms. |
| Capacitor 34 | 5000 mmf. |
| Resistor 33 | 100 ohms. |
| Resistor 32 | 100 ohms. |
| Capacitor 31 | 5000 mmf. |
| Capacitor 46 | 100 mmf. |
| Tube 28 | Type 6AG5. |
| Tube 48 | Type 6AL5. |
| Resistor 49 | 5600 ohms. |
| Capacitor 158 | 5000 mmf. |
| Capacitor 50 | 5 mmf. |
| Resistor 54 | 22,000 ohms. |
| Tube 55 | Type 6AG5. |
| Resistor 56 | 39,000 ohms. |
| Resistor 61 | 22,000 ohms. |
| Capacitor 57 | 4 mfd. |
| Capacitor 62 | 0.05 mfd. |
| Resistor 72 | 2200 ohms. |
| Capacitor 67 | 0.1 mfd. |
| Resistor 65 | 4700 ohms. |
| Resistor 68 | 820,000 ohms. |
| Resistor 69 | 270,000 ohms. |

| | |
|---|---|
| Resistor 70 | 47,000 ohms. |
| Tube 63 | 10BP4. |
| Capacitor 83 | 30–240 mmf. |
| Capacitor 79 | 0.002 mfd. |
| Resistor 87 | 820,000 ohms. |
| Capacitor 93 | 0.25 mfd. |
| Resistor 92 | 8200 ohms. |
| Capacitor 94 | 0.02 mfd. |
| Resistor 91 | 150,000 ohms. |
| Resistor 88 | 150,000 ohms. |
| Tube sections 80 and 89 | Type 6SNGT. |
| Resistor 86 | 2.7 megohms. |
| Capacitor 95 | .05 mfd. |
| Resistor 97 | 250,000 ohms, variable. |
| Resistor 90 | 100,000 ohms. |
| Resistor 160 | 10,000 ohms. |
| Capacitor 99 | 200 mmf. |
| Capacitor 82 | 5 mmf. |
| Resistor 81 | 560,000 ohms. |
| Resistor 85 | 150,000 ohms. |
| Capacitor 103 | 0.01 mfd. |
| Resistor 104 | 22,000 ohms. |
| Resistor 105 | 120,000 ohms. |
| Resistor 170 | 1000 ohms. |
| Capacitor 84 | 2000 mmf. |
| Capacitor 106 | 390 mmf. |
| Capacitor 163 | 10–160 mmf. |
| Resistor 107 | 1 megohm. |
| Resistor 164 | 47 ohms. |
| Tube 108 | Type 6BG6G. |
| Capacitor 110 | 5 mfd. |
| Resistor 109 | 82 ohms. |
| Resistor 127 | 4700 ohms. |
| Capacitor 128 | 0.05 mfd. |
| Capacitor 119 | 0.1 mfd. |
| Capacitor 124 | 0.05 mfd. |
| Resistor 121 | 10,000 ohms. |
| Capacitor 166 | 0.5 mfd. |
| Tube 118 | Type 6W4–GT. |
| Capacitor 116 | 10 mfd. |
| Capacitor 142 | 0.015 mfd. |
| Tube 143 | Half of type 6AL5. |
| Tube 135 | Type 12AX7. |
| Resistor 148 | 180 ohms. |
| Resistor 147 | 150,000 ohms. |
| Resistor 146 | 100,000 ohms. |
| Resistor 139 | 330,000 ohms. |
| Resistor 140 | 7000 ohms. |
| Capacitor 138 | 0.005 mfd. |
| Capacitor 150 | 2.5 mmf., variable. |
| Tube 66 | 1 section 12AX7. |
| Resistor 141 | 1 megohm. |
| Resistor 136 | 33,000 ohms. |
| Capacitor 137 | 47 mmf. |
| Resistor 149 | 100,000 ohms. |
| Capacitor 151 | 0.04 mfd. |
| Resistor 153 | 10,000 ohms. |
| Capacitor 154 | 0.005 mfd. |
| Resistor 155 | 10,000 ohms. |
| Capacitor 15 | 0.005 mfd. |
| Capacitor 41 | 5000 mmf. |
| Capacitor 43 | 5000 mmf. |
| Resistor 42 | 100 ohms. |

While there has been shown and described what is at present considered to be the preferred embodiment of the present invention, it will be obvious to those skilled in the art that various modifications and substitutions of equivalents may be made therein without departing from the true scope of the invention as defined by the appended claims.

We claim:

1. An automatic gain control system, for use with a television receiver of the type including a gain-controlled video channel, a video detector and a line-frequency deflection system providing a source of line-frequency pulses, comprising the combination of an electron tube having anode, cathode and grid electrodes for plate-rectifying said pulses, means including a series grid resistor having a value high with respect to the cathode-grid impedance of said tube for coupling said detector to the grid circuit of said tube, so as to apply to said circuit the detected signal, a source of fixed negative bias for said grid, said detector and coupling means and bias source being so arranged that the peaks of the synchronizing signal components render said tube conductive and that the region between those peaks and the grid circuit limiting condition is very narrow, whereby noise peaks extending in the direction of and beyond said synchronizing component peaks are limited, an inductance coupled to said line-frequency pulse source for applying to said anode said pulses of line-frequency, resistor means effectively in series with said inductance for applying to said anode a fixed positive bias and for differentially combining said positive bias and the rectified pulses appearing at said anode, the output potential of the last-mentioned resistor means being positive with respect to ground at zero video signal level and becoming less positive and finally negative as the video signal level is increased, a shunt capacitor cooperating with said resistor means to form a short time-constant filter for said rectified pulses, means in shunt with said differential-combining resistor for applying said output potential to the controlled stages as an amplified AGC potential only when it is of negative polarity, comprising a series combination of a diode and a resistor having a value great with respect to the resistance of said diode, one terminal of said resistor being connected to said differential-combining resistor means, whereby the plate-rectification current of said electron tube has substantially departed from the cut-off condition into a region of high gain when said output is applied to the controlled stages, and a capacitor in shunt with said diode and cooperating with the last-named resistor to form a long time-constant filter for said output potential.

2. An automatic gain control system, for use with a television receiver of the type including a gain-controlled video channel, a video detector and a line-frequency deflection system providing a source of line-frequency pulses, comprising the combination of an electron tube having anode, cathode and grid electrodes for plate rectifying said pulses, means including a series grid resistor having a value high with respect to the cathode-grid impedence of said tube for coupling said detector to the grid circuit of said tube, so as to apply to said circuit the detected signal, a source of fixed negative bias for said grid, said detector and coupling means and bias source being so arranged that the peaks of the synchronizing signal components render said tube conductive and that the region between those peaks and the grid circuit limiting condition is very narrow, whereby noise peaks extending in the direction of and beyond said synchronizing component peaks are limited, means for applying to said anode said pulses of line-frequency, means effectively in series with the last-named means for applying to said anode a fixed positive bias, means in D. C. circuit with said anode for differentially combining said positive bias and the rectified pulses appearing at said anode, while short time-constant integrating the latter, the output potential of the last-mentioned means being positive with respect to ground at zero video signal level and becoming less positive and finally negative as the video signal level is increased, means for long time-constant integrating said output potential, and means including a diode having its anode D. C. coupled to said positive bias means and to said combining means for applying said output potential to the controlled stages as an AGC potential only when it is of negative polarity, whereby the plate-rectification current of said electron tube has substantially departed from the cut-off condition when said output is applied to the controlled stages.

3. An automatic gain control system, for use with a television receiver of the type including a gain-controlled video channel, a video detector and a line-frequency deflection system providing a source of line-frequency pulses, comprising the combination of an electron tube having anode, cathode and grid electrodes for plate-rectifying said pulses, means including a series grid resistor having a value high with respect to the cathode-grid impedance of said tube for coupling said detector to the grid circuit of said tube, so as to apply to said circuit the detected signal, a source of fixed negative bias for said grid, said detector and coupling means and bias source being so arranged that the peaks of the synchronizing signal components render said tube conductive and that the region between those peaks and the grid circuit limiting condition is very narrow, whereby noise peaks extending in the direction of and beyond said synchronizing component peaks are limited, means inductively coupled to said line-frequency pulse source for applying to said anode said pulses of line-frequency, means in series with the last-named means for applying to said anode a fixed positive bias, means in D. C. circuit with said anode for differentially combining said positive bias and the rectified pulses appearing at said anode, the output potential of the last-mentioned means being positive with respect to ground at zero video signal lever and becoming less positive and finally negative as the video signal level is increased, and means in shunt with said differential-combining means for applying said output to the controlled stages as an amplified AGC potential only when it is of negative polarity, comprising a series combination of a diode and a resistor having a value great with respect to the resistance of said diode, the last-mentioned resistor being connected between said differential-combining means and the anode of said diode, whereby the plate-rectification current of said electron tube has substantially departed from the cut-off condition when said output is applied to the controlled stages, said diode having its anode in D. C. circuit with said positive bias means.

4. An automatic gain control system, for use with a television receiver of the type including a gain-controlled video channel, a video detector and a line-frequency deflection system providing a source of line-frequency pulses, comprising the combination of an electron tube having anode, cathode and grid electrodes for plate-rectifying said pulses, means including a series grid resistor having a value high with respect to the cathode-grid impedance of said tube for coupling said detector to the grid circuit of said tube, so as to apply to said circuit the detected signal, a source of fixed negative bias for said grid, said deflector and coupling means and bias source being so arranged that the peaks of the synchronizing signal components render said tube conductive and that the region between those peaks and the grid circuit limiting condition is very narrow, whereby noise peaks extending in the direction of and beyond said synchronizing component peaks are limited, an inductance coupled to said line-frequency pulse source for applying to said anode said pulses of line-frequency, resistor means effectively in series with said inductance for applying to said anode a fixed positive bias and for differentially combining said positive bias and the rectified pulses appearing at said anode, the output potential of the last-mentioned resistor means being positive with respect to ground at zero video signal level and becoming less positive and finally negative as the video signal level is increased, a shunt capacitor cooperating with said resistor means to form a short time-constant filter for said rectified pulses, means in shunt with said differential-combining resistor for applying said output potential to the controlled stages as an amplified AGC potential only when it is of negative polarity, comprising a series combination of a diode and a resistor having a value great with respect to the resistance of said diode, one terminal of said resistor being connected to said differential-combining resistor means, whereby the plate-rectification current of said electron tube has substantially departed from the cut-off condition into a region of high gain when said output is applied to the controlled stages, a capacitor in shunt with said diode and cooperating with the last-named resistor to form a long time-constant filter for said output potential, and a network for neutralizing the undesired voltage applied by the anode of said electron tube to its grid comprising a second inductance coupled to said line-frequency pulse source with opposite polarity to the first-mentioned inductance and a capacitor, both of said inductances and said capacitor being connected between the anode and grid of said electron tube.

FRANCIS A. WISSEL.
NORMAN W. PARKER.

References Cited in the file of this patent

UNITED STATES PATENTS

| Number | Name | Date |
|---|---|---|
| 1,687,061 | Bellescize | Oct. 9, 1928 |
| 2,178,766 | Tolson | Nov. 7, 1939 |
| 2,189,925 | Reinken | Feb. 13, 1940 |
| 2,197,900 | Schlesinger | Apr. 23, 1940 |
| 2,200,049 | Van Loon | May 7, 1940 |
| 2,203,043 | Brown | June 4, 1940 |
| 2,227,056 | Blumlein et al. | Dec. 31, 1940 |
| 2,230,295 | Holmes | Feb. 4, 1941 |
| 2,250,559 | Weber | July 29, 1941 |
| 2,299,292 | Allen | Oct. 20, 1942 |
| 2,305,931 | Martinelli | Dec. 22, 1942 |
| 2,307,375 | Blumlein et al. | Jan. 5, 1943 |
| 2,339,857 | Holmes | Jan. 25, 1944 |
| 2,402,096 | Somers | June 11, 1946 |
| 2,520,012 | Montgomery | Aug. 22, 1950 |
| 2,529,428 | Spielman | Nov. 7, 1950 |
| 2,538,150 | Farnham | Jan. 16, 1951 |
| 2,547,648 | Loughren | Apr. 3, 1951 |
| 2,593,011 | Cotsworth | Apr. 15, 1952 |

FOREIGN PATENTS

| Number | Country | Date |
|---|---|---|
| 845,897 | France | Sept. 4, 1939 |
| 851,899 | France | Jan. 16, 1940 |